US012787373B2

(12) United States Patent
Sato et al.

(10) Patent No.: US 12,787,373 B2
(45) Date of Patent: Nov. 3, 2026

(54) SEMICONDUCTOR DEVICE

(71) Applicant: SHINDENGEN ELECTRIC MANUFACTURING CO., LTD., Tokyo (JP)

(72) Inventors: Azusa Sato, Saitama (JP); Yoshifumi Matsuzaki, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 405 days.

(21) Appl. No.: 18/395,627

(22) Filed: Dec. 25, 2023

(65) Prior Publication Data

US 2024/0213308 A1 Jun. 27, 2024

(30) Foreign Application Priority Data

Dec. 27, 2022 (JP) ................................ 2022-210085

(51) Int. Cl.
*H10D 62/10* (2025.01)
*H10D 30/64* (2025.01)

(52) U.S. Cl.
CPC .......... *H10D 62/102* (2025.01); *H10D 30/64* (2025.01); *H10D 62/124* (2025.01)

(58) Field of Classification Search
CPC .. H10D 62/102; H10D 62/124; H10D 62/106; H10D 62/128; H10D 62/53; H10D 62/112; H10D 62/105; H10D 30/64; H10D 8/411; H10D 8/422
See application file for complete search history.

(56) References Cited

U.S. PATENT DOCUMENTS

| | | | | |
|---|---|---|---|---|
| 6,175,143 | B1 | 1/2001 | Fujihira et al. | |
| 6,221,688 | B1 | 4/2001 | Fujihira et al. | |
| 2001/0017393 | A1 | 8/2001 | Fujihira et al. | |
| 2001/0035560 | A1* | 11/2001 | Fujihira ................ | H10D 8/411 257/E29.328 |

(Continued)

FOREIGN PATENT DOCUMENTS

| | | | |
|---|---|---|---|
| JP | H10-335679 | A | 12/1998 |
| JP | 2008147362 | A | 6/2008 |

(Continued)

OTHER PUBLICATIONS

Extended European search report in EU application No. 23212494.1, dated Sep. 10, 2024, 10pp.

*Primary Examiner* — Sitaramarao S Yechuri
(74) *Attorney, Agent, or Firm* — HAUPTMAN HAM, LLP

(57) ABSTRACT

A semiconductor device includes, a semiconductor base body, an insulation layer that has an opening, and a surface electrode. The semiconductor base body includes a drift region, a p-type dopant region, and a peripheral dopant region. The p-type dopant region has a high concentration region that is formed in a region where the high concentration region overlaps with the p-type dopant region. A plurality of recombination centers are formed in the semiconductor base body, an inner peripheral end of the peripheral dopant region on the surface of the semiconductor base body is positioned on an inner peripheral side of an end portion of the opening, and a length from the inner peripheral end of the peripheral dopant region to the end portion of the opening is 0.01 μm or more to 130 μm or less.

4 Claims, 4 Drawing Sheets

(56) References Cited

U.S. PATENT DOCUMENTS

| | | | | |
|---|---|---|---|---|
| 2003/0030120 | A1 | 2/2003 | Fujihira et al. | |
| 2005/0151219 | A1 | 7/2005 | Fujihira et al. | |
| 2005/0179105 | A1 | 8/2005 | Fujihira et al. | |
| 2006/0244006 | A1 | 11/2006 | Fujihira et al. | |
| 2006/0278925 | A1* | 12/2006 | Yamaguchi .......... | H10D 62/106 257/E29.037 |
| 2015/0021747 | A1* | 1/2015 | Nishii ...................... | H10D 8/00 257/655 |
| 2015/0179825 | A1* | 6/2015 | Sung ...................... | H10D 62/60 257/632 |
| 2016/0056306 | A1* | 2/2016 | Masuoka ............. | H10D 62/109 257/483 |
| 2018/0130874 | A1* | 5/2018 | Takaoka ............... | H10D 84/811 |
| 2018/0182844 | A1* | 6/2018 | Nakamura ........... | H10D 62/105 |
| 2021/0288142 | A1* | 9/2021 | Hanagata ............. | H10D 12/481 |

FOREIGN PATENT DOCUMENTS

| | | | |
|---|---|---|---|
| JP | 2014056976 | A | 3/2014 |
| JP | 2018157040 | A | 10/2018 |

* cited by examiner recovery voltage wave forms recovery current wave forms

SEMICONDUCTOR DEVICE

RELATED APPLICATIONS

The present application claims priority to Japanese Application Number 2022-210085, filed Dec. 27, 2022, the disclosures of which applications are hereby incorporated by reference herein in their entirety.

TECHNICAL FIELD

The present invention relates to a semiconductor device.

BACKGROUND ART

Conventionally, there has been known a semiconductor device (diode) that includes a surface electrode connected to a semiconductor base body through an opening formed in an insulation layer (for example, see patent document 1).

FIG. 7 is a cross-sectional view illustrating a conventional semiconductor device 900. Symbol 917 indicates a guard ring. The semiconductor device described in patent document 1 (hereinafter referred to as the conventional semiconductor device 900) includes, as illustrated in FIG. 7, a semiconductor base body 910, an insulation layer 920, a surface electrode 930, a back surface electrode 940, and a surface protective film 950. The insulation layer 920 is formed on a surface of the semiconductor base body 910, has an opening 922 through which a surface of the semiconductor base body 910 is exposed. Further, the surface electrode 930 is connected with the semiconductor base body 910 at the opening 922.

The semiconductor base body 910 includes: a low resistance semiconductor layer 911 of an $n^+$ type; a drift region 912 of an n type; a p type dopant region 913 of a $p^-$ type that is formed in a surface layer portion of the drift region 912; and a peripheral dopant region 914 of a p type having dopant concentration higher than dopant concentration of the p type dopant region 913.

According to the conventional semiconductor device 900, due to the formation of the peripheral dopant region 914, a gradient of the dopant concentration at an outer peripheral end portion of the p type dopant region 913 is lowered so that a breakdown at the outer peripheral end portion of the p type dopant region 913 can be suppressed.

PRIOR ART

Patent Literature

[Patent literature 1] JP-A-10-335679

SUMMARY OF INVENTION

Technical Problem

Recently, attempts have been made so as to realize decarbonized society, and there has been a demand for electric equipment of a low loss along with such an attempt. In the technical field of a semiconductor device, a semiconductor device of high efficiency and low loss that can be used in such electric equipment has been requested.

However, in the conventional semiconductor device 900, at the time of turning on or off the switching, holes remaining in an outer peripheral region A2 flow into the surface electrode 930 via the peripheral dopant region 914. As result, a current density in the vicinity of a position where a current that flows into the surface electrode 930 via the p type dopant region 913 (a current generated by the holes remaining in an element forming region A1) and a current that flows into the surface electrode 930 via the peripheral dopant region 914 merge is sharply increased. Along with such a sharply increase of the current density, a temperature in the vicinity of the position at which the above-mentioned currents merge is sharply increased thus giving rise to draw back that it is difficult to increase a breakdown strength. Further, a reverse recovery current is sharply increased and hence, it is difficult to acquire a favorable recovery characteristic thus giving rise to drawback that a recovery loss is also increased.

The present invention has been made to overcome such drawbacks in view of the above-mentioned circumstances, and it is an object of the present invention to provide a semiconductor device that can increase a breakdown strength, and can acquire a favorable recovery characteristic thus minimizing the increase of a recovery loss.

Solution to Problem

According to a first aspect of the present invention, there is provided a semiconductor device that include: a semiconductor base body; an insulation layer formed on a surface of the semiconductor base body, the insulation layer having an opening through which the surface of the semiconductor base body is exposed; and a surface electrode connected to the semiconductor base body at the opening, wherein the semiconductor base body includes: a drift region of a first conductive type; a dopant region of a second conductive type formed in a surface layer portion of the drift region; and a peripheral dopant region of the second conductive type formed on a peripheral portion of the dopant region of the second conductive type in a surface layer portion of the drift region, having a region where the peripheral dopant region of the second conductive type overlaps with the dopant region of the second conductive type, the peripheral dopant region having dopant concentration higher than dopant concentration of the dopant region of the second conductive type, wherein the dopant region of the second conductive type has a high concentration region that is formed in a portion where the dopant region of the second conductive type overlaps with the peripheral dopant region and has higher dopant concentration than other regions of the dopant region of the second conductive type, a plurality of recombination centers are formed in the semiconductor base body, an inner peripheral end of the peripheral dopant region on the surface of the semiconductor base body is positioned on an inner peripheral side of an end portion of the opening, and a length from the inner peripheral end of the peripheral dopant region to the end portion of the opening is 0.01 μm or more to 30 μm or less.

According to a second aspect of the present invention, there is provided a semiconductor device that includes: a semiconductor base body; an insulation layer formed on a surface of the semiconductor base body, the insulation layer having an opening through which the surface of the semiconductor base body is exposed; and a surface electrode connected to the semiconductor base body at the opening, wherein the semiconductor base body includes: a drift region of a first conductive type; a dopant region of a second conductive type formed in a surface layer portion of the drift region; and a peripheral dopant region of the second conductive type formed on a peripheral portion of the dopant region of the second conductive type in a surface layer portion of the drift region, having a region where the peripheral dopant region of the second conductive type overlaps with the dopant region of the second conductive type, the peripheral dopant region having dopant concentration higher than dopant concentration of the dopant region of the second conductive type, wherein the dopant region of the second conductive type has a high concentration region that is formed in a portion where the dopant region of the second conductive type overlaps with the peripheral dopant region and has higher dopant concentration than other regions of the dopant region of the second conductive type, a plurality of recombination centers are formed in the semiconductor base body, an inner peripheral end of the peripheral dopant region on the surface of the semiconductor base body is located at a same position as an end portion of the opening or on an outer peripheral side of the end portion of the opening, and the dopant concentration of the high dopant region falls within a range of from $1.0\times10^{16}$ $cm^{-3}$ to $1.0\times10^{20}$ $cm^{-3}$.

According to the semiconductor device of the first aspect of the present invention, the recombination centers are formed in the semiconductor base body, and the length from the inner peripheral end of the peripheral dopant region to the end portion of the opening is 0.01 μm or more to 30 μm or less. Accordingly, at the time of turning on or off the switching, the hole or the like that is generated in the semiconductor base body including the outer peripheral region is collected by the recombination centers and hence, an amount of current per se that reaches the surface electrode can be reduced (the hole that reach the surface electrode is reduced). Accordingly, both of a current that flows into the surface electrode via the dopant region of the second conductive type and a current that flows into the surface electrode via the peripheral dopant region can be reduced and hence, current density in the vicinity of the position at which both current merge can be reduced whereby the increase of a temperature can be suppressed. As a result, a breakdown strength can be enhanced. Further, current density of the element forming region can be reduced and hence, a length from an inner peripheral end of the peripheral dopant region to an end portion of the opening can be reduced. Accordingly, the sudden increase of the recovery current can be prevented and hence, a recovery characteristic is improved whereby it is possible to suppress the increase of a recovery loss.

According to the semiconductor device of the second aspect of the present invention, the plurality of recombination centers are formed in the semiconductor base body, the inner peripheral end of the peripheral dopant region is located at the same position as the end portion of the opening or on the outer peripheral side of the end portion of the opening, and the dopant concentration of the high dopant region falls within a range of from $1.0\times10^{16}$ $cm^{-3}$ to $1.0\times10^{20}$ $cm^{-3}$. Accordingly, at the time of turning on or off the switching, the hole or the like that is generated in the semiconductor base body including the outer peripheral region is collected by the recombination centers and hence, an amount of current per se that reaches the surface electrode can be reduced. Accordingly, current density in the vicinity of a position where current density of a current that flows into the surface electrode from the element forming region via the dopant region of the second conductive type and current density of a current that flows into the dopant region of the second conductive type from the peripheral dopant region and flows into the surface electrode overlap with each other can be reduced and hence, the increase of a temperature can be suppressed. As a result, a breakdown strength can be enhanced. Further, current density of the element forming region can be reduced and hence, even when the peripheral dopant region and the surface electrode do not abut each other, a breakdown strength can be held. Further, the peripheral dopant region and the surface electrode do not abut each other, the sudden increase of the recovery current can be prevented and hence, a recovery characteristic is improved whereby it is possible to suppress the increase of a recovery loss.

According to the semiconductor device of the first aspect of the present invention and the semiconductor device of the second aspect of the present invention, the dopant region of the second conductive type is formed on the portion where the dopant region of the second conductive type overlaps with at least the peripheral dopant region, and has the high concentration region where the dopant concentration is higher than the dopant concentration in other regions of the region of the second conductive type. Accordingly, it is possible to prevent the occurrence of a phenomenon that the hole in the outer peripheral region flows into the surface of the element forming region due to difference in dopant concentration between the dopant region of a second conductive type and the peripheral dopant region. As a result, the increase of current density on the surface of the element forming region can be prevented and hence, it is possible to provide the semiconductor device that further enhances a breakdown strength.

MODE FOR CARRYING OUT THE INVENTION

Hereinafter, a semiconductor device according to the present invention is described based on embodiments illustrated in drawings. The embodiments described hereinafter are not intended to limit the invention described in claims. Further, it is not always the case that all of various constitutional components and the combinations of these constitutional components described in the embodiments are indispensable in the means to solve the problems according to the present invention.

Embodiment 1

1. Configuration of Semiconductor Device 100 According to Embodiment 1

Figure 1:
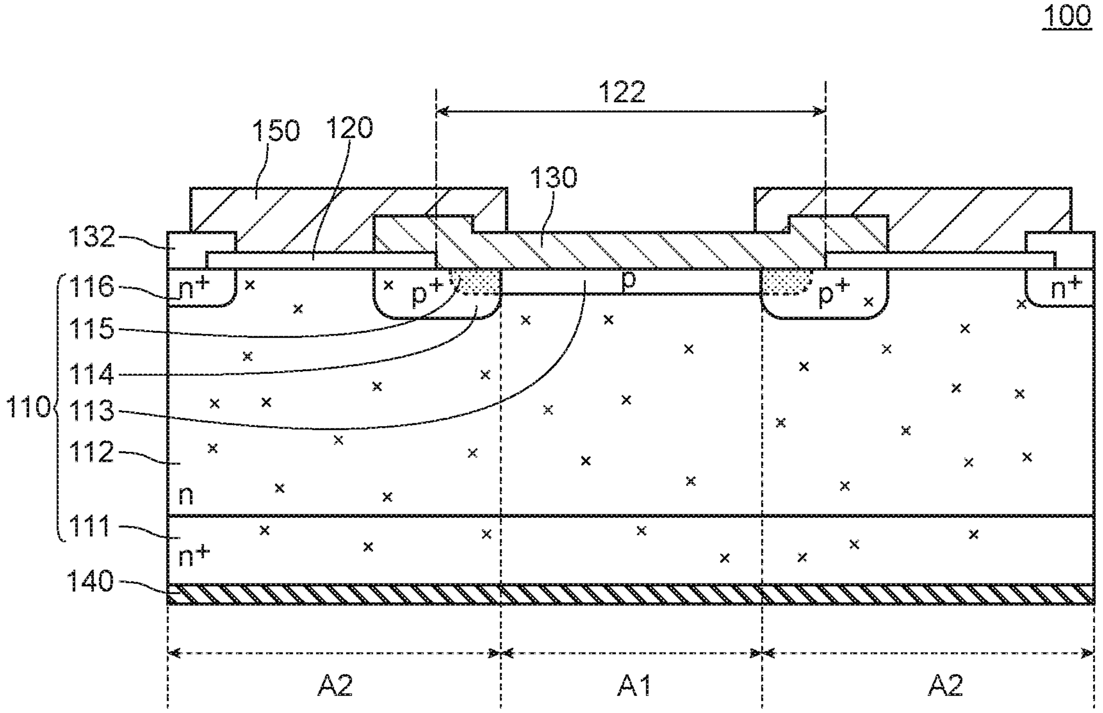
FIG. 1 is a cross-sectional view of a semiconductor device 100 according to an embodiment 1.
Figure 2:
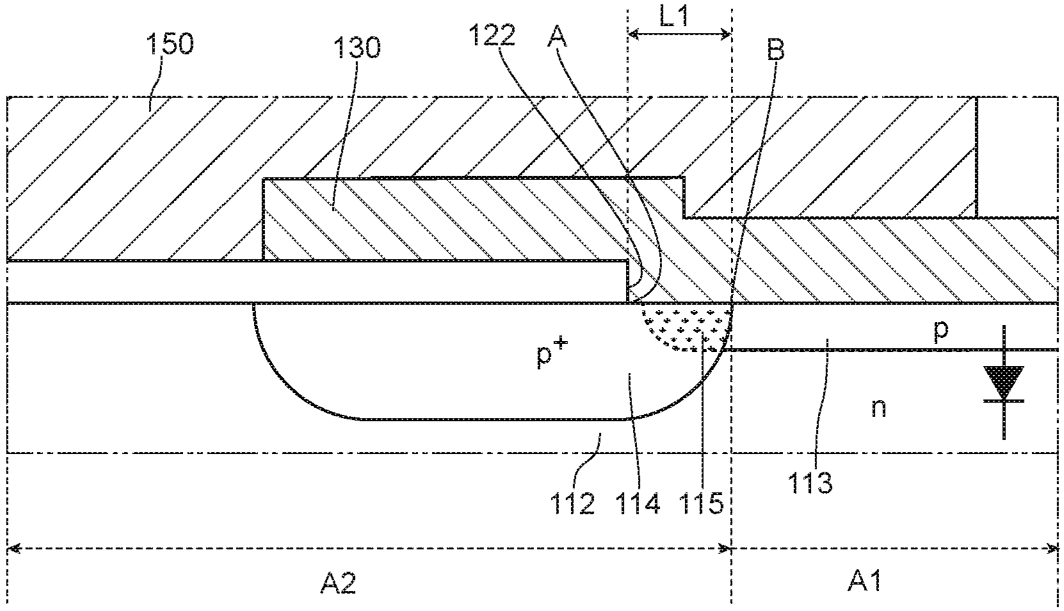
FIG. 2 is an enlarged cross-sectional view of a main part of the semiconductor device 100 according to the embodiment 1.

FIG. 1 is a cross-sectional view illustrating the semiconductor device 100 according to the embodiment 1. In the drawing, "x" indicates recombination centers. FIG. 2 is an enlarged cross-sectional view of a main part of the semiconductor device 100 according to the embodiment 1. As illustrated in FIG. 1, the semiconductor device 100 according to the embodiment 1 includes: a semiconductor base body 110; an insulation layer 120 that is formed on a surface of the semiconductor base body 110, has an opening 122 through which a surface of the semiconductor base body 110 is exposed; a surface electrode 130 that is connected to the semiconductor base body 110 at the opening 122; a back surface electrode 140 that is formed on a back surface side of the semiconductor base body 110; an equi-potential ring electrode (EQR electrode) 132 that is formed in the vicinity of an outermost periphery of a surface of the semiconductor base body 110; a protective insulation film 150 having an opening at a center portion thereof.

The semiconductor device 100 according to the embodiment 1 is formed of an element forming region A1 and an outer peripheral region A2. In the embodiment 1, a region on an inner peripheral side of an inner peripheral end B of a peripheral dopant region 114 described later is referred to as an element forming region A1, and a region disposed on an outer peripheral side of the inner peripheral end B of the peripheral dopant region 114 is referred to as an outer peripheral region A2.

The semiconductor base body 110 includes: a low resistance semiconductor region 111 of an $n^+$-type; a drift region 112 of an n-type; a p-type dopant region 113 formed in a surface layer portion of the drift region 112; the peripheral dopant region 114 of a $p^+$-type formed on a peripheral edge portion of the p-type dopant region 113 in the surface layer portion of the drift region 112, having a portion that overlaps with the p-type dopant region 113, and having the dopant concentration higher than the dopant concentration of the p type dopant region 113; and a channel stop region 116 of an $n^+$-type formed on an outer most periphery of the semiconductor base body 110.

The recombination centers are formed in the semiconductor base body 110. The recombination centers may be formed by irradiating electron beams to the semiconductor base body 110 (performing annealing thereafter), or may be formed by applying heavy metal (for example, platinum or gold) to the semiconductor base body and, thereafter by diffusing heavy metal by heating.

The dopant concentration of the drift region 112 falls within a range of from $1.0\times10^{13}$ $cm^{-3}$ to $1.0\times10^{15}$ $cm^{-3}$. The channel stop region 116 is connected to the EQR electrode 132 positioned on the outer most periphery of the semiconductor base body 110. The dopant concentration in the channel stop region 116 is higher than the dopant concentration in the drift region 112.

The p-type dopant region 113 includes a region that overlaps with the peripheral dopant region 114. A high concentration region 115 is formed in the region that overlaps with the peripheral dopant region 114. In this embodiment 1, the high concentration region 115 is formed only in the region where the p-type dopant region 113 and the peripheral dopant region 114 overlap with each other. However, the high concentration region 115 may be formed on an inner peripheral side of the overlapping region besides the overlapping region. The dopant concentration of the high concentration region 115 is higher than the dopant concentration of other regions of the p-type dopant region 113, and is higher than the dopant concentration of the peripheral dopant region 114. The dopant concentration of the high concentration region 115 falls within a range of from $1.0\times10^{16}$ $cm^{-3}$ to $1.0\times10^{20}$ $cm^{-3}$, more preferably within a range of from $2.0\times10^{17}$ $cm^{-3}$ to $1.0\times10^{20}$ $cm^{-3}$.

As illustrated in FIG. 1 and FIG. 2, the p-type dopant region 113 is formed inside the opening 122, and an end portion of the p-type dopant region 113 is positioned on an inner peripheral side of an end portion of the opening 122. In a region between an end portion of the p-type dopant region 113 on an outer peripheral side (an end portion of the high concentration region 115 on an outer peripheral side) and an end portion B of the opening 122, the peripheral dopant region 114 and the surface electrode 130 abut each other. The dopant concentration of the p-type dopant region 113 is lower than the dopant concentration of the high concentration region 115, falls within a range of from $5.0\times10^{15}$ $cm^{-3}$ to $4.4\times10^{16}$ $cm^{-3}$, for example.

A depth of the peripheral dopant region 114 is greater than a depth of the p type dopant region 113. The inner peripheral end B of the peripheral dopant region 114 on the surface of the semiconductor base body 110 is positioned on an inner peripheral side of the end portion A of the opening 122. A length L1 from the inner peripheral end B of the peripheral dopant region 114 to the end portion A of the opening 122 is 0.01 um or more and less than 30 um. The dopant concentration of the peripheral dopant region 114 is lower than the dopant concentration of the high concentration region 115. Accordingly, the dopant concentration is increased in the ascending order of the p type dopant region 113, the peripheral dopant region 114, and the high concentration region 115.

2. Mode of Carriers at the Time of Turning on or Off Switching in the Semiconductor Device 100 According to Embodiment 1.

Before describing the mode of carriers at the time of turning on or off switching in the semiconductor device 100 according to the embodiment 1, the mode of carriers at the time of turning on or off switching in the conventional semiconductor device 900 is described.

In the conventional semiconductor device 900 at the time of turning on switching, when a voltage is applied between the surface electrode 930 and the back surface electrode 940, the holes that are carriers move in the semiconductor base body 910 from the surface electrode 930 toward the back surface electrode 940. Then, when a voltage is not applied between the surface electrode 930 and the back surface electrode 940 so that the switching is turned off, the holes in the semiconductor base body 910 move toward the surface electrode 930 and are recovered in the surface electrode 930.

Also, in the outer peripheral region A2, the residual holes move toward the surface electrode 930. However, the insulation layer 920 is formed on the surface of the semiconductor base body 910 in the outer peripheral region A2 and hence, the holes move toward the element forming region A1, and is recovered by the surface electrode 930 via the peripheral dopant region 914. Accordingly, current density in the vicinity of the peripheral dopant region 914 and the p-type dopant region 913 is increased and hence, it is difficult to increase a breakdown strength. Further, the holes take time until the holes reach the surface electrode 930 and hence, a reverse restoring time is prolonged.

To the contrary, in the outer peripheral region of the semiconductor device 100 according to the embodiment 1, the following configurations are adopted. (1) The recombination centers are formed at the semiconductor base body 110 and hence, the holes are recovered at the recombination centers and hence, the holes per se that move toward the element forming region are decreased. Further, (2) The inner peripheral end B of the peripheral dopant region 114 on the surface of the semiconductor base body 110 is positioned on an inner peripheral side of the end portion A of the opening 122. Accordingly, not only the holes move toward the surface electrode 130 via the peripheral dopant region 113 in the same manner as the prior art, the holes move toward the surface electrode 130 via the p-type dopant region 114. Accordingly, the holes can be recovered efficiently. Further, (3) The high concentration region 115 of the p-type dopant region 113 is formed in a region where the p-type dopant region 113 and the peripheral dopant region 114 abut against each other. Accordingly, it is possible to prevent current density of a current that flows in the peripheral dopant region 114 from becoming larger than current density of a current that flows in the p-type dopant region 113 and hence, the difference in concentration between dopant region in the p-type dopant region 113 and the dopant in the peripheral dopant region 114 can be alleviated whereby the increase of current density can be prevented. Further, a length S1 from an inner peripheral end of the peripheral dopant region 114 to an end portion of the opening 122 is equal to or more than 0.01 μm to less than 30 μm and hence, as indicated by the waveform of "present invention configuration" illustrated in FIG. 3A and FIG. 3B, the recovery voltage takes a soft recovery waveform. As a result, the recovery voltage can be suppressed. Further, a reverse recovery current can be decreased.

3. Advantageous Effect of Semiconductor Device 100 According to Embodiment 1

According to the semiconductor device 100 of the embodiment 1, the recombination centers are formed in the semiconductor base body 110, and the length L1 from the inner peripheral end of the peripheral dopant region 114 to the end portion of the opening 122 is less than 0.01 μm or more to less than 30 μm. Accordingly, at the time of turning on or off the switching, the holes or the like generated in the semiconductor base body 110 including the outer peripheral region A2 are recovered by the recombination centers and hence, an amount of current per se that reaches the surface electrode 130 is decreased (the holes that reach the surface electrode 130 can be decreased). Accordingly, it is possible to reduce both a current that flows into the surface electrode 130 via the p-type dopant region 113 and a current that flows into the surface electrode 130 via the peripheral dopant region 114 can be reduced and hence, a current density in the vicinity of a point where the currents merge can be reduced whereby the increase of a temperature can be suppressed. As a result, a breakdown strength can be increased. Further, the current density of the element forming region A1 can be reduced and hence, the length L1 from the inner peripheral end of the peripheral dopant region 114 to the opening 122 can be made small. Accordingly, the sharp increase of a recovery current can be prevented and hence, it is possible to acquire a recovery current having a favorable recovery characteristic whereby the increase of a recovery loss can be suppressed.

In the embodiment 1, the reason that the length L1 from inner peripheral end of the peripheral dopant region 114 to the end portion of the opening 122 to 0.01 μm or more is as follows. In a case where the length L1 from the inner peripheral end of the peripheral dopant region 114 to the opening 122 is less than 0.01 μm, an area that the peripheral dopant region 114 and the surface electrode 130 are brought into contact with each other is small and hence, the holes that is shifted from the peripheral dopant region 114 to the surface electrode 130 are small in number and hence, it is difficult to effectively recover the holes. Further, the reason that the length L1 from the inner peripheral end of the peripheral dopant region 114 is set to less than 30 μm is as follows. In a case where the length L1 from the inner peripheral end of the peripheral dopant region 114 to the end portion of the opening 122 is 30 μm or more, the area with which the peripheral dopant region 114 and the surface electrode 130 are brought into contact with each other is increased and hence, a recovery current is sharply increased whereby a recovery loss is increased (see waveform in "conventional structure").

Figure 3A:
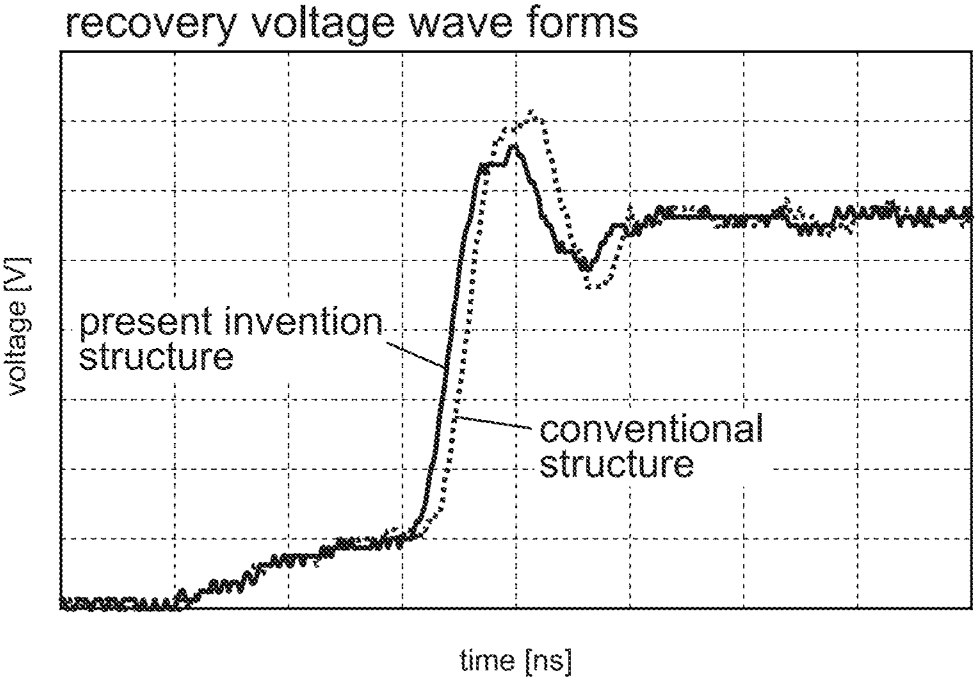
FIG. 3A and FIG. 3B are graphs illustrating recovery voltage wave forms and recovery currents of "conventional structure" and "present invention structure".
Figure 3B:
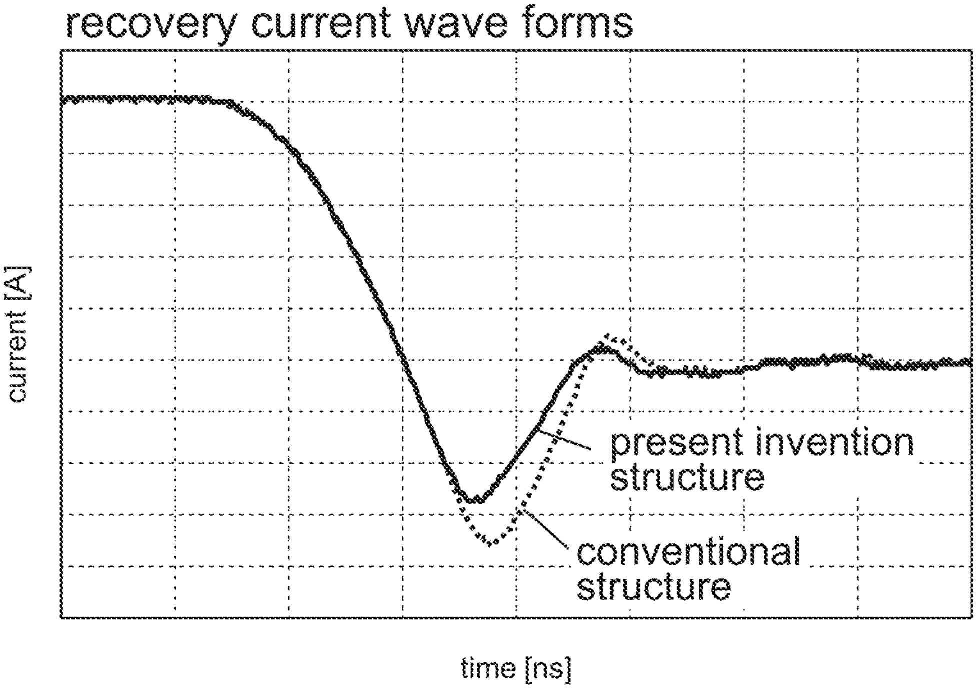

FIG. 3A and FIG. 3B are graphs illustrating a recovery voltage and a recovery current of "conventional structure" and a recovery voltage and a recovery current of "present invention structure". FIG. 3A illustrates a recovery voltage waveform of "conventional structure" and a recovery voltage waveform of "present invention structure", and FIG. 3B illustrates a recovery current waveform of "conventional structure" and a recovery current waveform of "present invention structure". In FIG. 3A and FIG. 3B, "conventional structure" (indicated by a broken line in FIG. 3A and FIG. 3B) is a semiconductor device having the configuration substantially equal to the configuration 100 according to the embodiment 1 except for a point that the length L1 from an inner peripheral end of the peripheral dopant region 114 to an end portion of the opening portion 122 is 60 μm. Further, "the present invention structure (indicated by a solid line FIG. 3A and FIG. 3B) is a semiconductor device having substantially the same configuration as the semiconductor device 100 according to the embodiment 1.

As illustrated in FIG. 3A, at the time of turning on or off switching, with respect to the "waveform of a recovery voltage of "the present invention structure", a peak of the recovery voltage after being raised is smaller than a waveform peak of the waveform of the "conventional structure", and an amplitude of ringing of the recovery voltage immediately behind the peak is small. Further, as illustrated in FIG. 3B, at the time of turning on or off switching, the waveform of a recovery current of "the present invention structure" has a large reverse recovery current thus having a short reverse recovery time compared to the waveform of "the conventional structure".

Assume a case where the whole p-type dopant region 113 is a high concentration region, at the time of turning on or off switching, although current density of the p-type dopant region can be reduced, a current is liable to rapidly flow into the surface electrode 130 and hence, the recovery of the current tends to become the hard recovery and hence, it is difficult for the recovery voltage to have a favorable recovery waveform. On the other hand, according to the semiconductor device 100 of the embodiment 1, the high concentration region 115 is formed only in the region where the p-type dopant region 113 and the peripheral dopant region 114 overlap with each other. Accordingly, a current flows to the surface electrode 130 relatively slowly and hence, the recovery of the current tends to become the soft recovery and hence, the recovery voltage can have a favorable recovery waveform.

Further, according to the semiconductor device 100 of the embodiment 1, the dopant concentration of the drift region 112 falls within a range of from $1.0\times10^{13}$ $cm^{-3}$ to $1.0\times10^{15}$ $cm^{-3}$. Accordingly, at the time of turning on or off switching, current density (an amount of holes) of a recovery current can be made relatively small. Further, the recombination centers are formed in the semiconductor base body 110 and hence, the holes can be recovered whereby current density of the recovery current in the vicinity of the surface of the semiconductor base body 110 can be further reduced. As a result, the breakdown strength can be further enhanced.

Embodiment 2

Figure 4:
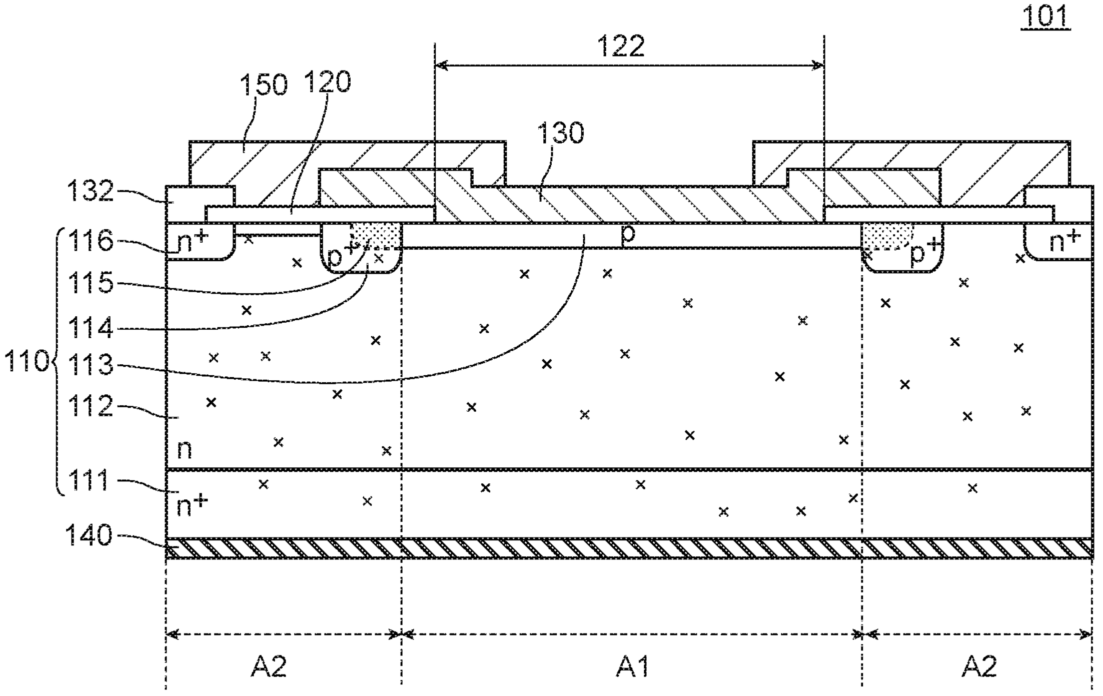
FIG. 4 is a cross-sectional view of a semiconductor device 101 according to an embodiment 2.
Figure 5:
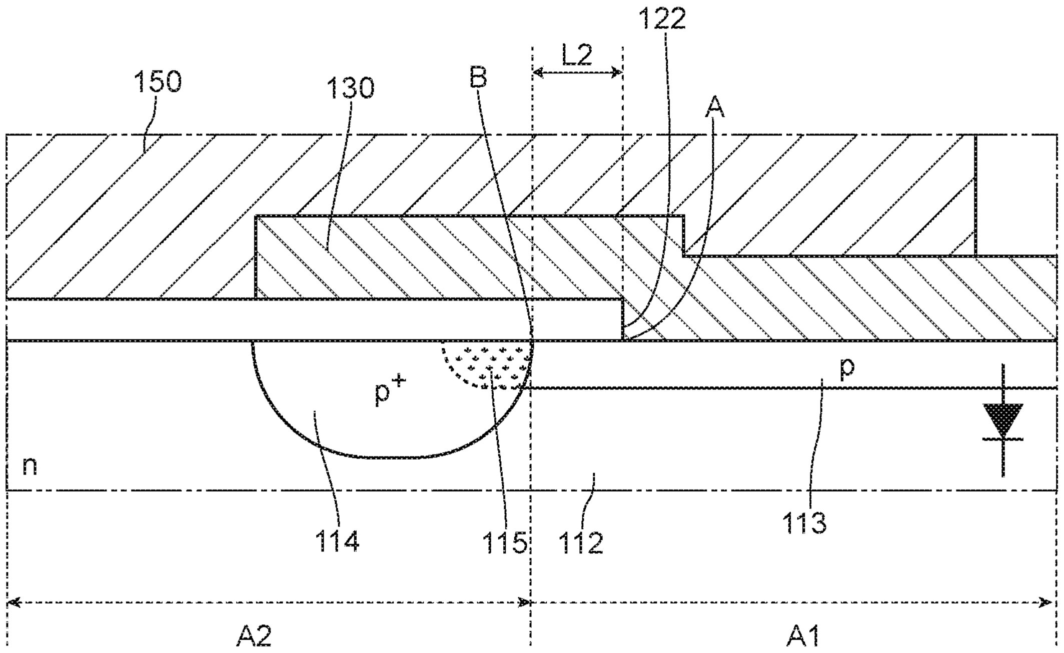
FIG. 5 is an enlarged cross-sectional view of a main part of the semiconductor device 101 according to the embodiment 2.

FIG. 4 is a cross-sectional view of a semiconductor device 101 according to the embodiment 2. FIG. 5 is an enlarged cross-sectional view of a main part of the semiconductor device 101 according to the embodiment 2. The semiconductor device 101 according to the embodiment 2 basically has substantially the same configuration as the semiconductor device 100 according to the embodiment 1. However, the semiconductor device 101 according to the embodiment 2 differs from the semiconductor device 100 according to the embodiment 1 with respect to the position of an inner peripheral end of a peripheral dopant region on a surface of a semiconductor base body (see FIG. 4 and FIG. 5). That is, in the semiconductor device 101 according to the embodiment 2, an inner peripheral end B of a peripheral dopant region 114 on the surface of the semiconductor base body 110 is positioned on an outer peripheral side of an end portion A of an opening 122. Accordingly, the peripheral dopant region 114 does not abut against a surface electrode 130.

A p-type dopant region 113 extends to an outer peripheral side of the opening 122, and has a region that overlaps with the peripheral dopant region 114. In the same manner as the embodiment 1, a high concentration region 115 is formed only in a region where the p-type dopant region 113 and the peripheral dopant region 114 overlap with each other (strictly speaking, only in the vicinity of the above-mentioned overlapping region). Accordingly, the high concentration region 115 also does not abut against the surface electrode 130, and is connected to the surface electrode 130 via other portions of the p-type dopant region 113.

The dopant concentration of the high concentration region falls within a range of from $1.0\times10^{16}$ $cm^{-3}$ to $1.0\times10^{20}$ $cm^{-3}$. It is more preferable that the dopant concentration of the high concentration region fall within a range of $2.0\times10^{17}$ $cm^{-3}$ to $1.0\times10^{20}$ $cm^{-3}$. This dopant concentration of high concentration region is higher than the dopant concentration of the p-type dopant region 113, and is higher than dopant concentration of the peripheral dopant region 114. Accordingly, also in the embodiment 2, the dopant concentration is increased in an ascending order of the p-type dopant region 113, the peripheral dopant region 114 and the high concentration region 115.

As described above, in the semiconductor device 101 according to the embodiment 2, the position of the inner peripheral end of the peripheral dopant region on the surface of the semiconductor base body differs from the corresponding position in the semiconductor device 100 according to the embodiment 1. However, the recombination centers are formed in the semiconductor base body 110, the inner peripheral end of the peripheral dopant region 114 is positioned on an outer peripheral side of an end portion of the opening 122, and the dopant concentration of the high concentration region 115 falls within a range of $1.0\times10^{16}$ $cm^{-3}$ to $1.0\times10^{20}$ $cm^{-3}$. Accordingly, at the time of turning on or off switching, the holes or the like that are generated in the semiconductor base body 110 including the outer peripheral region A2 are recovered around the recombination centers and hence, a current amount per se that reaches the surface electrode 130 can be reduced. Accordingly, it is possible to reduce current density in the vicinity of a region where current density of a current that flows to the surface electrode 130 from an element forming region A1 via the p-type dopant region 113 and current density of a current that flows into the p-type dopant region 113 from the peripheral dopant region 114 and flows into the surface electrode 130 overlap with each other and hence, the increase of a temperature can be suppressed. As a result, a breakdown strength can be enhanced. Further, current density of the element forming region A1 can be reduced and hence, the breakdown strength can be held even in a case where the peripheral dopant region 114 and the surface electrode 130 do not abut against each other. The peripheral dopant region 114 and the surface electrode 130 do not abut against each other and hence, a rapid increase of a recovery current can be suppressed whereby a favorable recovery characteristic can be obtained. As a result, the increase of recovery loss can be suppressed.

According to the semiconductor device 101 of the embodiment 2, the p-type dopant region 113 extends to an outer peripheral side of the opening 122. Accordingly, the holes flow to the surface electrode 130 from the peripheral dopant region 114 (high concentration region 115) via the p-type dopant region 113 having relatively low concentration. Accordingly, favorable recovery characteristics can be obtained. As a result, the increase of recovery loss can be suppressed.

The semiconductor device 101 according to the embodiment 2 has substantially the same configuration as the semiconductor device 100 according to the embodiment 1 with respect to points except for the position of the inner peripheral end of the peripheral dopant region on the surface of the semiconductor base body. Accordingly, the semiconductor device 101 according to the embodiment 2 acquires advantageous effects acquired by the substantially same corresponding configurations amongst advantageous effects that the semiconductor device 100 according to the embodiment 1 acquires.

Heretofore, the present invention has been described based on the embodiments described above. However, the present invention is not limited to the above-mentioned embodiments. The present invention can be carried out in various modes without departing from the gist of the present invention. For example, the following modifications are also conceivable.

(1) The positions, the connections, the number of constitutional components and the like described in the respective embodiments described above (also including the respective modifications, the same understanding being also applicable to the following modifications) are provided for an exemplifying purpose, and are altered within scope that advantageous effects of present invention are not jeopardized.

(2) In the above-mentioned embodiment 2, the semiconductor device is configured such that the inner peripheral end of the peripheral dopant region 114 on the surface of the semiconductor base body 110 is positioned on the outer peripheral side of the end portion of the opening 122. However, the present invention is not limited to such a configuration. The inner peripheral end of the peripheral dopant region 114 on the surface of the semiconductor base body 110 may be positioned at the same position as the end portion of the opening 122 with respect to the horizontal direction.

(3) In the abovementioned embodiment, a diode is used as the semiconductor device. However, the present invention is not limited to such a configuration. A MOSFET may be used as the semiconductor device, or other suitable semiconductor devices may be also used as the semiconductor device according to the present invention.

(4) In the above-mentioned respective embodiments, the high concentration region is formed only in the region where P-type dopant region and the peripheral dopant region overlap with each other. However, the present invention is not limited to such a configuration. The high concentration region may be formed in a region other than the region where a second conductive type dopant region where the p-type dopant region and the peripheral dopant region overlap with each other. However, in the case where the whole second conductive type dopant region is formed as the high concentration region, such configuration is not desirable from a viewpoint of a recovery characteristic. Accordingly, it is desirable that the second conductive type dopant region have a region other than the high concentration region.

(5) In the above-mentioned respective embodiments, the configuration is adopted where the dopant concentration of the drift region falls within a range of $1.0\times10^{13}$ $cm^{-3}$ to $1.0\times10^{15}$ $cm^{-3}$. However, the present invention is not limited to such a configuration. The present invention is also applicable to a case where the dopant concentration of the drift region falls in a range other than the above-mention range.

(6) In the above-mentioned respective embodiments, a p-type gourd ring region may be formed on an outer peripheral side of the peripheral dopant region 114. The number of the p-type gourd ring regions may be plural. Further, it is desirable that a depth of the gourd ring be equal to a depth of the peripheral dopant region 114.

Figure 6:
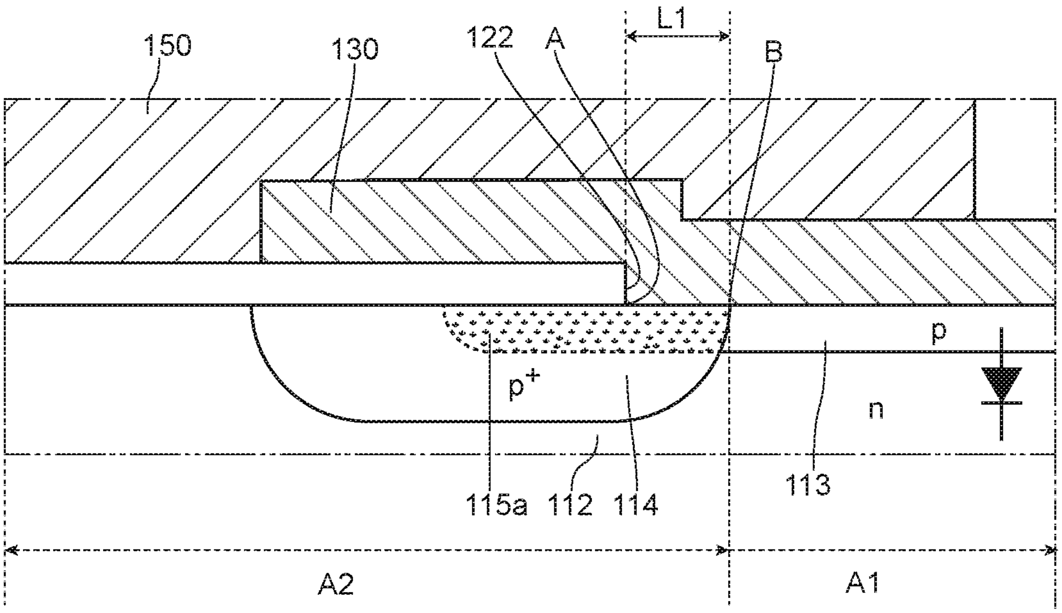
FIG. 6 is an enlarged cross-sectional view of a main part of the semiconductor device according to a modification.
Figure 7:
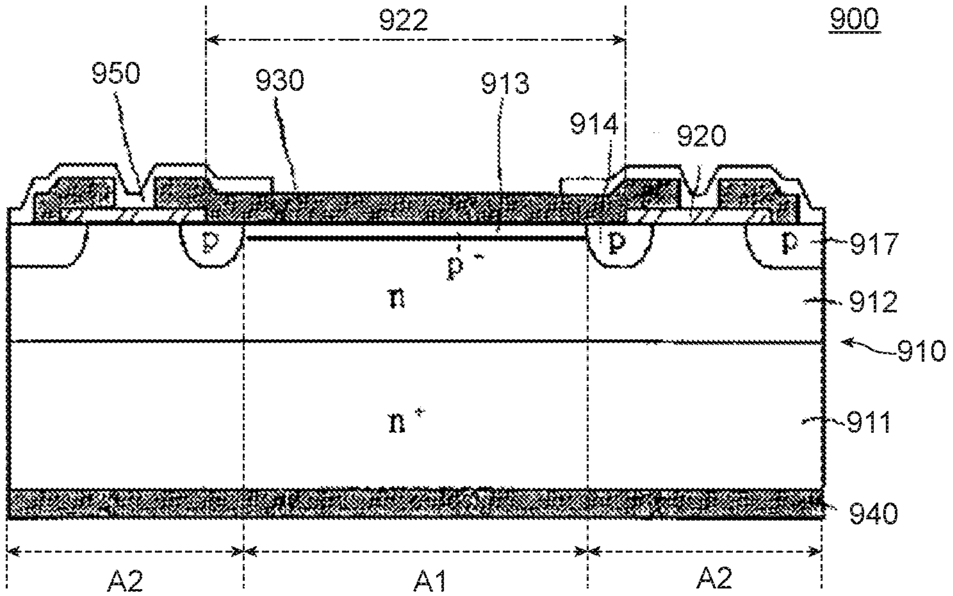
FIG. 7 is a cross-sectional view illustrating a conventional semiconductor device 900.

(7) In the above-mentioned respective embodiments, the outer peripheral end of the p-type dopant region 113 is disposed inside the inner peripheral end A of the insulation layer 120. However, the present invention is not limited to such a configuration. The outer peripheral end of the p-type dopant region 113 may be disposed outside the inner peripheral end A of the insulation layer 120 (see FIG. 6).

The invention claimed is:

1. A semiconductor device comprising:

a semiconductor base body;

an insulation layer on a surface of the semiconductor base body, the insulation layer having an opening through which the surface of the semiconductor base body is exposed; and a surface electrode connected to the semiconductor base body at the opening, wherein the semiconductor base body includes:

a drift region of a first conductive type;

a dopant region of a second conductive type in a surface layer portion of the drift region; and a peripheral dopant region of the second conductive type on a peripheral portion of the dopant region of the second conductive type in a surface layer portion of the drift region, having a region where the peripheral dopant region of the second conductive type overlaps with the dopant region of the second conductive type, the peripheral dopant region having dopant concentration higher than dopant concentration of the dopant region of the second conductive type, wherein the dopant region of the second conductive type has a high concentration region that is in a portion where the dopant region of the second conductive type overlaps with the peripheral dopant region and has higher dopant concentration than other regions of the dopant region of the second conductive type, a plurality of recombination centers are in the semiconductor base body, an inner peripheral end of the peripheral dopant region on the surface of the semiconductor base body is positioned on an inner peripheral side of an end portion of the opening, an outer peripheral end of the dopant region 113 is positioned on the inner peripheral side of and spaced from the end portion A of the opening 122, and a length from the inner peripheral end of the peripheral dopant region to the end portion of the opening is 0.01 um or more to 30 μm or less.

2. The semiconductor device according to claim 1, wherein the high concentration region is in only a region where the dopant region of the second conductive type and the peripheral dopant region overlap with each other.

3. The semiconductor device according to claim 1, wherein the dopant region of the second conductive type extends to an outer peripheral side of the opening.

4. The semiconductor device according to claim 1, wherein the dopant concentration of the drift region falls within a range of from $1.0\times10^{13}$ $cm^{-3}$ to $1.0\times10^{15}$ $cm^{-3}$.

* * * * *